Jan. 22, 1957

R. A. LEBOWITZ 2,778,941

WIDE RANGE OSCILLATOR

Filed Nov. 6, 1952

INVENTOR

Robert A. Lebowitz

BY Ralph B. Stewart

ATTORNEY 2,778,941

WIDE RANGE OSCILLATOR

Robert A. Lebowitz, Brooklyn, N. Y., assignor to Polytechnic Research & Development Co., Inc., Brooklyn, N. Y., a corporation of New York Application November 6, 1952, Serial No. 319,090
10 Claims. (Cl. 250—36)

Figures 1, 2:
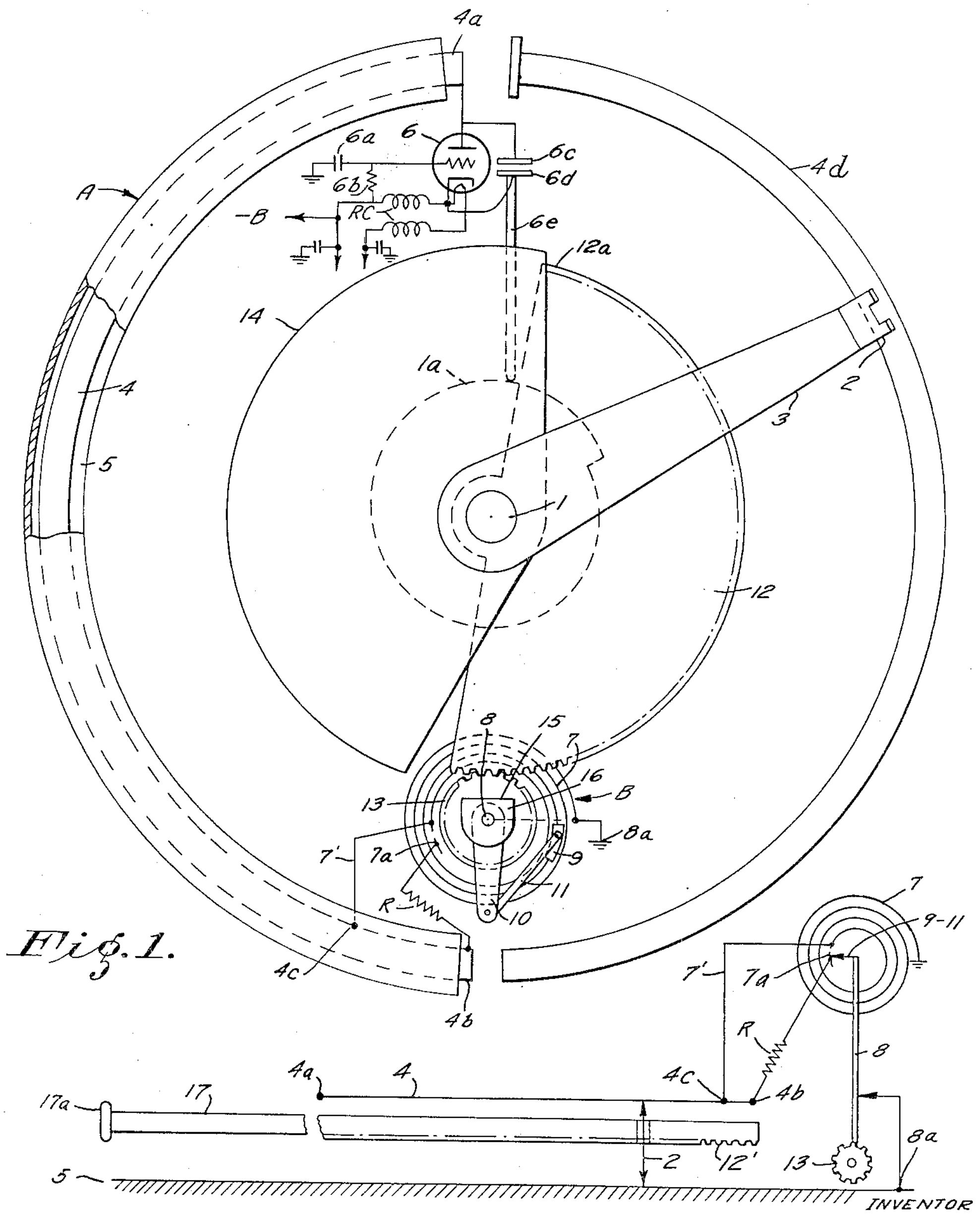

This invention relates to an oscillator for the generation of electric oscillations having a wide range of frequency.

One object of the invention is to devise an oscillator which has stable operation throughout a wide frequency range.

My improved oscillator involves the use of a grid-controlled electron tube in which a tunable circuit is connected between two of the electrodes of the tube. Stable operation of the oscillator is obtained throughout the frequency range by providing for the simultaneous variation of the feed-back coupling between the plate and grid circuits of the tube as the resonant frequency of the tuned circuit is varied.

Where the tuned circuit of the oscillator comprises a resonant transmission line of variable length connected between the grid and plate elements of the electron tube, the oscillator is capable of operating at a number of modes higher than the fundamental mode when the length of the line is an odd number of greater wavelengths. For the purpose of maintaining the tuned line in oscillation at the quarter-wavelength mode, or the fundamental mode, arrangements are provided for increasing the effective cathode-to-plate capacity of the tube in the lower frequency range of the oscillator, that is, at frequencies lower than 200 magacycles.

My improved oscillator employs a variable tuner of the type disclosed in the application of Herbert A. Finke, Serial No. 309,899 filed September 16, 1952. This type of tuner involves a variable inductance of the type formed of a linear conductor or line having distributed inductance and capacitance, and the low frequency portion of the tuning range is covered by a variable inductance formed of a coiled conductor having a number of convolutions. These two variable inductances are connected in series between a terminal and ground or between two terminals. Both inductances are provided with sliding contacts for varying the amount of the inductance included in the circuit between the two terminals. In operation, the tuning or operating member first operates the sliding contact on the linear conductor to insert an increasing amount of this conductor in the circuit, the coiled inductance being completely out of the circuit or being shortcircuited during this range of operation. After the entire amount of the linear inductance is included in the circuit, the contact on the coiled inductance is then operated by the tuning member to insert an increasing amount of the coiled inductance in the circuit.

A further object of my invention is to devise a tuner of the type referred to above wherein there is no appreciable frequency change or step in moving from one section of the tuner to the other.

Still another object of my invention is to devise means for connecting a loading resistor across the end of the inactive part of the tuned line or linear conductor throughout the operation of the tuner in the high frequency range and to remove the loading resistor from tuned line while the tuner is operating in the low frequency portion of its tuning range.

While my improved tuner is shown as applied to an oscillator, it will be understood that it may be used in any other application requiring a tuned circuit capable of being tuned throughout a wide range of frequencies.

My invention is illustrated in the accompanying drawing in which Fig. 1 is a diagrammatic representation of my oscillator circuit embodying the preferred form of tuner, and Fig. 2 is a diagrammatic, showing of a second form of tuner according to my invention.

Referring to Fig. 1, the section of the oscillator tuner covering the high frequency range is formed of a section of coaxial line indicated generally at A, and the section of the tuner covering the low frequency part of the tuning range is formed of a spiral inductance indicated generally at B. The coaxial line section A is formed in a circular arc about the axis of the tuning shaft 1, and its outer conductor is provided with a longitudinal slot opening towards the shaft for receiving a short-circuiting slider 2, carried on the end of arm 3 formed of insulating material and mounted on shaft 1. The slider 2 enters the space between the center conductor 4 and the outer conductor 5 of the coaxial cable and establishes a short-circuit or bridge connection between these two conductors, thus varying the effective length of the cable from the slider to either end of the cable. One end 4a of the center conductor 4 is connected to the anode of an electron tube 6, the remaining electrodes of which are connected to form an oscillation generating circuit of the well-known Colpitts type. The cathode of tube 6 is isolated from ground at radio frequencies by the double choke RC in the heater leads. The grid of the tube is effectively grounded through condenser 6a and resistor 6b provides a leak path to the grounded side of choke RC. Thus, the tuned line A is connected between the anode and grid elements of tube 1 and oscillations are sustained by the feedback provided by the plate-to-cathode capacity. The frequency of the generated oscillations is inversely proportioned to the length of the line from end 4a to the slider 2 when the slider is operating in section A of the tuner.

The other end of line conductor 4 is connected by connection 7' to the inner end of the spiral conductor 7 forming section B of the tuner. This connection is made to conductor 4 at the point 4c which is spaced from the extreme end 4b for the purpose described later. Conductor 7 is spiralled about the axis of shaft 8 which is grounded as represented at 8a, and the outer end of conductor 7 also is grounded. A sliding contact 9 is mounted to slide along conductor 7 and is operated from the shaft 8 by means of an arm 10 mounted on the shaft and connected to the slider 9 through a pivoted link 11. This construction was selected merely for the purpose of illustration, and any other suitable arrangement for operating the sliding contact may be employed, such as shown in Figs. 9 to 11 of the patent to Ware, 2,163,645. Also, while I prefer to form the B section of the tuner as a spiral inductance as shown in Fig. 1, this section may assume the form of a helical inductance of a well-known type, such as illustrated in Figs. 1 and 2 of the above-mentioned Ware patent.

At the inner end of the spiral conductor 7 a short section 7a is insulated from the remainder of the spiral and the slider 9 rests upon this insulated section when it reaches the innermost end of its travel. The section 7a is connected to the end 4b of line conductor 4 through a loading resistor R.

The operating shaft 8 of section B of the tuner is driven from the operating shaft 1 by means of a segmental gear 12 mounted on the shaft 1 and engaging pinion 13 carried by the shaft 8. The arrangement is such that the gear 12 is disengaged from the pinion 13 throughout the range of movement of shaft 1 where the slider 2 is in engagement with the coaxial line forming section A of the tuner. The gear 12 is so mounted that it engages the pinion 13 at the point 12*a* when the slider 2 moves out of engagement with the end 4*b* of the conductor 4. Continued counter-clockwise movement of the arm 3 rotates the shaft 8 in a clockwise direction and thereby moves the slider 9 in a clockwise direction to include more and more of the spiral conductors 7 in the circuit between the terminal 4*a* and the terminal 8*a*. The shaft 8 is conductively connected to the slider 9 through the arm 10 and the link 11. When the gear 12 is operated in a clockwise direction, the shaft 8 rotates in an anti-clockwise direction, and when the gear disengages the pinion at the point 12*a* on the gear, the slider 9 is located on the insulated inner end section 7*a* of the spiral conductor 7. At this point a locking disc 14 mounted on the shaft 1 moves into locking engagement with the flat face 15 of a dog 16 carried by the shaft 8. The peripheral edge of disc 14 maintains locking engagement with the face 15 throughout the range of movement of the slider 2 in section A of the tuner. This prevents movement of the slider 9 from the point 7*a* in the spiral section except when the gear 12 is in engagement with pinion 13. The track section 4*d* for slider 2 is formed of any hard material to resist wear from the sliding movement and does not enter into the electrical operation of the tuner.

It will be seen that the slider 9 remains on the insulated section 7*a* while the slider 2 moves over section A of the tuner. Thus the loading resistor R remains connected across the end of the inactive part of line conductor 4 during operation within the high frequency section of the tuner. Resistor R is of a value approximating the characteristic impedance of line section A. Its function is to prevent resonance effects in the unused section of the conductor 4.

When the tuner is operating in the low frequency section, the slider 9 moves away from the conductor section 7*a* and disconnects the loading resistor R from line conductor 4. The point 4*c* where the spiral conductor 7 is connected to line conductor 4 is spaced from the end 4*b* a distance such that there is no substantial frequency change when the slider 2 moves out of contact with the end 4*b* and the slider 9 moves into engagement with the inner end of spiral 7.

In one embodiment of my invention according to Fig. 1, section A of the tuner covers frequencies from 900 megacycles down to 150 megacycles, and section B covers from 150 megacycles down to 35 megacycles.

In order to permit tuning of only the grid-plate circuit of the oscillator over the broad range from 35 to 900 mc./s. it is necessary for the total cathode-to-ground impedance to be capacitive over the entire range. Since there must also be a D.-C. return between the cathode and ground for heater and cathode currents, it is necessary to provide a choke that will supply the necessary D.-C. return and yet permit capacitive reactance between cathode and ground at all oscillating frequencies. This is accomplished by providing a choke having a self-resonant frequency in the neighborhood of or below the lowest operating frequency of the oscillator. A double-winding choke may be used in the heater circuit and for providing a cathode return path leading to a source of high negative potential, as shown at —B in Figure 1.

As explained above, there is a possibility that the line A may oscillate at higher modes as the length of the line increases. For the purpose of maintaining the oscillation at the fundamental mode, I provide for increasing the plate-to-cathode capacitance of tube 6 as the slider 2 moves towards the low-frequency end 4*b* of line conductor 4. This may be accomplished by connecting a variable condenser across the plate and cathode elements and controlling this condenser by operation of shaft 1 to increase the capacitance as the slider 2 approaches the end 4*b*. One suitable arrangement is shown diagrammatically in Figure 1 where the variable condenser is formed of a fixed plate 6*c* connected to the anode of tube 6 and a movable plate 6*d* connected to the cathode. Plate 6*d* is carried by a sliding rod 6*e* which is moved by a cam 1*a* carried by shaft 1. The cam 1*a* is shaped so that plates 6*d* and 6*e* are widely separated over the high frequency end of line A. Beginning at about 200 mc. plate 6*d* is moved closer to plate 6*e* as the oscillator frequency decreases. This by-passes the plate resistance of tube 6 with an increasing capacity value as the frequency decreases. The capacity of the by-pass condenser may continue to increase as the slider 9 moves over spiral inductor 7.

It is not necessary to form section A of the tuner in an arcuate form but it may be arranged in a straight line form as shown in Fig. 2 where the same reference numerals indicate corresponding parts shown in Fig. 1. In this arrangement, the center conductor 4 of the coaxial cable is arranged in a straight line and the short-circuiting slider 2, instead of being operated from a rotary shaft, is operated from a sliding bar 17 carrying an operating handle 17*a* on the outer end thereof.

The bar 17 is movable throughout a predetermined range of movement to shift the slider 2 from the end 4*a* of the line 4 throughout the length of line 4 and beyond the end 4*b* a distance sufficient to operate the B section of the tuner which is formed of the same spiral inductance as in Fig. 1. In this case, the bar 17 carries a toothed rack 12′ arranged to engage and operate the pinion 13 for the same purpose as the gear 12 in Fig. 1. The end of the rack 12′ engages the pinion 13 when the slider 2 is at the point to move away from the end 4*b* of the line 4. In this case also the shaft 8 may be provided with a locking dog for locking the sliding contact 9—11 in its zero position by means of a locking bar carried by the sliding bar 17.

In both forms of tuner the movable operating member is arranged to insert the tuning conductor of section A into the circuit at a predetermined rate, and the rate of insertion of the tuner conductor in the circuit is greatly increased in section B of the tuner for the same rate of movement of the operating member. This produces a more linear relation between the movement of the operating member and the frequency of the tuned circuit. In Fig. 1 this is accomplished by means of a speed multiplying gear train connected between the tuning shaft 1 and the shaft 8 to produce a number of revolutions of the shaft 8 for an angular movement of the shaft 1 through less than 180 degrees. In Fig. 2, the rectilinear movement of the bar 17 is converted into rotary movement of the shaft 8 when the tuner is operating in section B. While it is possible to employ other forms of coiled inductance in section B of the tuner, it is preferred to use a spiral inductance for the reason that, for a given rate of rotation for the shaft 8, the amount of conductor 7 inserted in the circuit progressively increases as the slider 9 proceeds from the inner end 7*a* of the conductor to the outer end of the spiral. An indicator dial may be carried by shaft 1 and marked in frequency or wavelength. A graduated scale may also be mounted on or located adjacent the bar 17 for indicating frequency or wavelength.

In the appended claims the term "linear conductor" is used to distinguish from a coiled conductor formed of a number of turns or convolutions. This term is applied to the conductor in section A of the tuner in both figures of the drawing.

I claim:

1. An oscillation generator comprising an electron tube having a cathode, an anode and a control grid, a tuned circuit connected between the control grid and the anode and comprising a transmission line having a short-circuiting slider for varying the length thereof, a high-frequency choke coil connected in the space-current lead to said cathode, a variable condenser connected directly between said anode and said cathode independently of said choke coil, and common operating means for operating said slider and said variable condenser simultaneously to increase the capacitance of said condenser as the length of said line is increased.

2. An oscillation generator comprising an electron tube having a cathode, an anode and a control grid, a tuned circuit connected between the control grid and the anode and having moveable tuning means for varying the resonant frequency of said circuit, a high-frequency choke coil connected in the space-current lead to said cathode, a variable condenser connected directly between said anode and said cathode independently of said choke coil, and common operating means for operating said tuning means and said variable condenser simultaneously to increase the capacitance of said condenser as the resonant frequency of said tuned circuit decreases.

3. An oscillation generator comprising an electron tube having a cathode, an anode, and a control grid, a tuned circuit connected between the control grid and the anode and having tuning means for varying the resonant frequency of said circuit, a condenser connecting said control grid to ground through a path of substantially zero impedance at all frequencies of said tunable circuit, means including a choke coil in the space-current lead to said cathode for maintaining a capacitive reactance of the cathode with respect to ground at all frequencies of oscillation, a variable condenser connected directly between said anode and said cathode independently of said choke coil and means for simultaneously operating said tuning means and said variable condenser to increase the capacitance of said variable condenser as the resonant frequency of said tuned circuit decreases.

4. An oscillation generator comprising an electron tube having a cathode, an anode, and a control grid, a tuned circuit connected between the control grid and the anode and comprising a first conductor having one end thereof connected to said anode and having a grounded sliding contact moveable throughout its length and beyond the other end thereof, a second conductor having a grounded sliding contact moveable throughout its length, means connecting one end of said second conductor to said other end of said first conductor, an operating member moveable throughout a given range of movement, means controlled by movement of said member over a portion of said range for moving the slider on said first conductor throughout its range of movement, means controlled by the movement of said member in the remaining portion of said range for moving the sliding contact of said second conductor throughout its entire range of movement, a high-frequency choke coil connected in the space-current lead to said cathode, a variable condenser connected directly between said anode and said cathode independently of said choke coil, and means controlled by the movement of said operating member for increasing the capacitance of said variable condenser as the resonant frequency of said tuned circuit decreases.

5. An oscillation generator comprising an electron tube having a cathode, an anode, and a control grid, a tuned circuit connected between the control grid and the anode and comprising a first conductor having one end thereof connected to said anode and having a grounded sliding contact moveable throughout its length and beyond the other end thereof, a second conductor having a grounded sliding contact moveable throughout its length, means connecting one end of said second conductor to said other end of said first conductor, an insulated contact located at said one end of said second conductor and being engaged by the sliding contact of said second conductor at one end of its range of movement, a resistor connected between said insulated contact and said one end of said first conductor, an operating member moveable throughout a given range of movement, means controlled by movement of said member over a portion of said range for moving the slider on said first conductor throughout its range of movement, means controlled by the movement of said member in the remaining portion of said range for moving the sliding contact of said second conductor throughout its entire range of movement, a variable condenser connected directly between said anode and said cathode, and means controlled by the movement of said operating member for increasing the capacitance of said variable condenser as the resonant frequency of said tuned circuit decreases.

6. An oscillation generator comprising an electron tube having a cathode, an anode, and a control grid, a rotary shaft, a first variable inductance comprising a linear conductor arranged in an arcuate path about said rotary shaft and covering an arc of only a portion of a complete circle, a sliding contact engaging said linear conductor and mounted for rotation with said rotary shaft, a second rotary shaft arranged parallel with said first shaft and spaced therefrom, a second variable inductance comprising a conductor coiled about the axis of said second shaft in a number of convolutions, a second sliding contact engaging said coiled conductor and mounted for rotation by said second shaft, a pinion mounted on said second shaft, a segmental gear carried by said first shaft and positioned to engage said pinion when said first sliding contact is in a position to move away from one end of said linear conductor, said segmental gear operating to turn said second shaft through a number of revolutions while said first sliding contact rotates through the remaining angular portion of said circle, means connecting the other end of said linear conductor to the anode of said electron tube, means connecting the said one end of said linear conductor to one end of said coiled conductor, an insulated contact located at said one end of said coiled conductor and being engaged by the sliding contact of said coiled conductor at one end of its range of movement, a resistor connected between said insulated contact and said one end of said linear conductor, a variable condenser conected directly between the anode and cathode elements of said tube, and means controlled by said first rotary shaft for increasing the capacitance of said variable condenser as the frequency of oscillation of said generator decreases.

7. In a radio wave tuner, the combination of a first conductor having a sliding contact movable throughout the length thereof, a second conductor having a sliding contact movable throughout its length, an operating member movable throughout a given range of movement, means controlled by movement of said member over a portion of asid range for moving the slider on said first conductor throughout its range of movement, means controlled by the movement of said member in the remaining portion of said range for moving the sliding contact of said second conductor throughout its entire range of movement, an insulated contact located at one end of said second conductor and being engaged by the sliding contact of said second conductor at one end of its range of movement, and a resistor connected between said insulated contact and one end of said first conductor.

8. In a radio wave tuner, the combination of a first conductor having a grounded sliding contact moveable throughout the length of said conductor and beyond one end thereof, a second conductor having a grounded sliding contact movable throughout its length, means grounding one end of second conductor, a connection between the other end of second conductor and said first conductor, an insulated contact located at the ungrounded end of said second conductor and being engaged by the sliding contact of said second conductor at one end of its range of movement, a resistor connected between said insulated contact and the said one end of said first conductor, an operating member movable throughout a given range of movement, means controlled by movement of said member over a portion of said range for moving the sliding contact on said first conductor throughout its range of movement, and means controlled by the movement of said member in the remaining portion of said range for moving the sliding contact of said second conductor from engagement with said insulated contact to the other end of its range of movement at the grounded end of said second conductor, the sliding contact of said first conductor being out of engagement with said first conductor during movement of said operating member through said remaining portion of its movement.

9. A radio wave tuner according to claim 8 wherein said connection from the second conductor is completed to the first conductor at a point removed from said one end of said first conductor to prevent a frequency jump when the first sliding contact leaves said first conductor and said second sliding contact engages said second conductor.

10. In a radio wave tuner, the combination of a rotary shaft, a first variable inductance comprising a linear conductor arranged in an arcuate path about said rotary shaft and covering an arc of only a portion of a complete circle, a grounded sliding contact engaging said linear conductor and mounted for rotation with said rotary shaft, a second rotary shaft arranged parallel with said first shaft and spaced therefrom, a second variable inductance comprising a conductor coiled about the axis of said second shaft in a number of convolutions, a second grounded sliding contact engaging said coiled conductor and mounted for rotation by said second shaft, a pinion mounted on said second shaft, a segmental gear carried by said first shaft and positioned to engage said pinion when said first sliding contact is in a position to move away from one end of said linear conductor, said segmental gear operating to turn said second shaft through a number of revolutions while said first sliding contact rotates through the remaining angular portion of said circle, means grounding one end of said coiled conductor, means connecting the other end of said coiled conductor to said linear conductor at a point spaced from said one end thereof, an insulated contact located at said other end of said coiled conductor and being engaged by the sliding contact of said coiled conductor at one end of its range of movement, and a resistor connected between said insulated contact and said one end of said linear conductor.

References Cited in the file of this patent

UNITED STATES PATENTS

| | | |
|---|---|---|
| 1,339,772 | Lowenstein | May 11, 1920 |
| 2,126,541 | De Forest | Aug. 9, 1938 |
| 2,292,254 | Van Beuren | Aug. 4, 1942 |
| 2,429,656 | Willoughby | Oct. 28, 1947 |
| 2,543,560 | Thias | Feb. 27, 1951 |
| 2,627,578 | Klein | Feb. 3, 1953 |
| 2,666,906 | Aust | Jan. 19, 1954 |